United States Patent [19]

Ohkawa et al.

[11] Patent Number: 5,334,863
[45] Date of Patent: Aug. 2, 1994

[54] SEMICONDUCTOR MEMORY DEVICE HAVING A MESHLIKE GROUNDING WIRING

[75] Inventors: Masayoshi Ohkawa; Fumihiko Hayashi, both of Tokyo, Japan

[73] Assignee: NEC Corporation, Tokyo, Japan

[21] Appl. No.: 895,034

[22] Filed: Jun. 8, 1992

[30] Foreign Application Priority Data

Jun. 6, 1991 [JP] Japan .................. 3-134534
Jul. 15, 1991 [JP] Japan .................. 3-172849

[51] Int. Cl.[5] ............................ H01L 29/78
[52] U.S. Cl. ...................... 257/69; 257/393; 257/903
[58] Field of Search ............ 257/903, 69, 393

[56] References Cited

U.S. PATENT DOCUMENTS 5,072,286 12/1991 Minami et al. ................. 257/903
5,132,771 7/1992 Yamanaka et al. ............. 257/401

FOREIGN PATENT DOCUMENTS 1-202858 8/1989 Japan .

Primary Examiner—Robert Limanek
Attorney, Agent, or Firm—Foley & Lardner

[57] ABSTRACT

In an SRAM having TFT type memory cells, a pair of driver transistors and a pair of access transistors formed of N-channel MOS transistors on a silicon substrate are respectively arranged at positions point symmetric with respect to the center of gravity of the memory cell, and a pair of load transistors formed of P-channel type TFTs is also arranged in point symmetric positions with respect to the center of gravity. The gate electrodes of these N-channel MOS transistors and a word line are formed of a first layer of conductor film, a grounding wiring within the memory cell is formed of a second layer of conductor film, and TFTs are formed of a third and a fourth layers of conductor films. Two connecting holes for the digit lines and the drain regions of the access transistors are also arranged distributed point symmetric with respect to the center of gravity. As a result, the grounding wiring is extended respectively in the direction parallel to the word line and in the direction parallel to the digit lines, forming a meshlike shape. The relative resistance value of the grounding wiring is decreased and its bit dependence is also reduced. Because of this, the detection sensitivity at the time of read is improved. Moreover, due to the above-mentioned shape of the grounding wiring, the space between the channel region of the TFT and the gate electrode of the driver transistor can be shielded by the grounding wiring, and the leakage characteristic of the TFT can be improved.

8 Claims, 10 Drawing Sheets

SEMICONDUCTOR MEMORY DEVICE HAVING A MESHLIKE GROUNDING WIRING

BACKGROUND OF THE INVENTION

1. Field of the Invention

The present invention relates to a semiconductor memory device and, more particularly, to a MOS static type semiconductor memory device the load element thereof consisting of a P-channel type thin film transistor (TFT).

2. Description of the Prior Art

There are two kinds of memory cells, namely, a high load resistance type memory cell and a CMOS type memory cell in a MOS static type semiconductor memory cell (referred to as an SRAM hereinafter). A high load resistance type memory cell is constituted of a pair of high load resistance elements, a pair of driver transistors, each consisting of an N-channel MOS transistor, and a pair of access transistors each consisting of an N-channel MOS transistor. The respective one ends are connected to a power supply wiring, the other ends of these high load resistance elements are connected respectively to the drain regions of the driver transistors, and the respective source regions of these driver transistors are connected to a grounding wiring. The pair of driver transistors are coupled to form a flip-flop circuit. The source regions of the pair of access transistors are respectively connected to the drain regions of these driver transistors, a word line is connected to the gate electrodes of the access transistors, and a pair of digit lines are connected respectively to the drain regions of the access transistors.

The CMOS type memory cell is constituted by a pair of load transistors, each consisting of a P-channel MOS transistor, a pair of driver transistors each consisting of an N-channel MOS transistor, and a pair of access transistors each consisting of an N-channel MOS transistor. A pair of CMOS inverters constituted of these two load transistors and these two driver transistors are coupled to form a flip-flop circuit. In the CMOS inverter, the drain region of the load transistor is connected to the drain region of the driver transistor, the gate electrode of the load transistor is connected to the gate electrode of the driver transistor, the source region of the load transistor is connected to the power supply wiring, and the source region of the driver transistor is connected to the grounding wiring. The connection relationship of the source region, the drain region, and the gate region is the same as for the high load resistance memory cell.

When a polycrystalline silicon film is used as the high load resistance element in the high load resistance type memory cell, the area of the memory cell is smaller than the area of the CMOS type memory cell due to the fact that the high load resistance element is formed above the driver transistor and the like via an insulating film and that the number of the nodes is small compared with the case of the CMOS type memory cell. In other words, the high load resistance type memory cell is advantageous for reduction of the area of the memory cell (cell size). On the other hand, the CMOS type memory cell is advantageous over the high load resistance type memory cell in that the value of the off-current is smaller than that of the on-current. In other words, the standby current of the CMOS type memory cell is smaller than the other. The new SRAM has drawn attention in recent years as a back-up memory for an electronic notebook, gaming apparatus, or the like. Batteries are used as the back-up power supply with these memories being operated by a low voltage power supply of 1.5 to 3V, and it becomes important that the standby current is low. TFTs are beginning to be adopted as the P-channel MOS transistor for the load transistor, for the purpose of reducing the area of the CMOS type memory cell (such a memory cell will be referred to as a TFT type memory cell hereinafter).

In an SRAM having TFT type memory cells, the formation of the power supply wiring, the grounding wiring, the word line, and the pair of digit lines that are to be connected to one memory cell, the formation of one memory cell from its constituent elements of four N-channel MOS transistors and two P-channel type TFTs, the mutual connection between these transistors, and the connection between these transistors and the wirings are realized by means of a plurality of layers of electrical conduction film or the like. Although there are many alternatives available for construction of the respective wirings and the component elements, the respective connections, or the like, the general construction is done as in the following.

These N-channel MOS transistors are respectively formed on the surface of a silicon substrate, and the respective gate electrode and the word line of these transistors are formed of a first layer of conductor film. The grounding wiring is formed of a second layer of conductor film in order for it to be connected to the source region of the driver transistor, and in order to avoid crossing with the gate electrode and the word line within the same memory cell and the crossing with the connecting wirings between the TFT and these N-channel MOS transistors. The TFTs are formed of a third and fourth layers of conductor films. The first and the second layers of conductor films are respectively made of an N+-type polycrystalline silicon film or a high melting point metallic film or a silicide film or a polycide film. The gate electrode of the TFT is formed of either one of the third or the fourth conductor film. This conductor film is a P+-type polycrystalline silicon film or an N+-type polycrystalline silicon film or a high melting point metallic film or a silicide film or a polycide film. The power supply wiring serves also as the source region of the TFT. Its drain region and the channel region are formed of the other of the third and the fourth layers of conductor film. This conductor film consists of a polycrystalline silicon film where it is a P+-type polycrystalline silicon film except for the channel region. The first, the second, the third, and the fourth layers of conductor film consist of materials that have melting point higher than that of aluminum. The digit line is formed of an aluminum film.

The reason for forming the digit lines using an aluminum film is the following. In general, the value of the current that flows in the four kinds of wirings is the largest for the grounding wiring followed by the digit line and the power supply wiring, and hardly any current flows in the word line. The digit line is a signal line, and since the signal is detected with a sense amplifier, the digit line is required to have a low resistance in particular. For this reason, it is usual to form the digit line of a low resistance material, such as aluminum film.

The grounding wiring is not formed of an aluminum film for the following reason. The digit lines are provided with a high density approximately parallel in a prescribed direction, and the spacing between a pair of digit lines in the above becomes one factor for specifying the cell size. For example, if the grounding wirings are aluminum films, it increases the spacing of the pair of digit lines and makes the cell size larger, opposing the trend for miniaturization of the semiconductor device.

A SRAM having TFT memory cells of the aforementioned structure is disclosed in, for example, Japanese Patent Laid Open No. 202858-1989. First, the constitution of the circuit will be described. The memory cell of the (m, n) bit is constituted of a first and a second access transistors consisting of an N-channel MOS transistor, a first and a second driver transistors consisting of an N-channel MOS transistor, first and a second P-channel load transistor TFTs, a first and second digit lines of the m-th column, a word line of the n-th row, a power supply wiring, and a grounding wiring. The word line is connected to the respective gate electrodes of the first and the second access transistors, and the first and the second digit lines are connected to the drain regions of the first and the second access transistors, respectively. A first CMOS inverter is constituted of the first TFT and the first driver transistor, a second CMOS inverter is constituted of the second TFT and the second driver transistor, and the first CMOS inverter and the second CMOS inverter are coupled to form a flip-flop. The power supply wiring is connected to the respective source regions of the first and the second driver transistors. The source region of the first access transistor is connected to the drain region of the first driver transistor. The source region of the second access transistor is connected to the drain region of the second driver transistor. Diodes of the P-N junction are formed respectively between the drain region of the first TFT and the drain region of the first driver transistor, and between the drain region of the second TFT and the drain region of the second driver transistor.

Next, the device of the memory cell of the (m, n) bit of the SRAM disclosed in the above-mentioned Laid Open Japanese Patent application will be described. The first and second access transistors and the first and second driver transistors are formed, respectively, on the surface of the P-type region of the silicon substrate. The respective gate electrodes of the first and the second driver transistors and the word line for the n-th row are formed by an N+-type polycrystalline silicon film of the first layer. This word line also serves as the gate electrodes of the first and the second access transistors. An N+-type diffused layer, which is the source region of the first access transistors, and an N+-type diffused layer which is the drain region of the first driver transistor are connected by the gate electrode of the second driver transistor via a connecting hole reaching an N+-type diffused layer which is the source region of the first access transistor and a connecting hole reaching an N+-type diffused layer which is the drain region of the first driver transistor. The source region of the second access transistor and the drain region of the second driver transistor are formed of the same N+-type diffused layer. The gate electrode of the first driver transistor is connected to this N+-type diffused layer via a connecting hole that reaches this N+-type diffused layer.

A first grounding wiring which is the grounding wiring within the memory cell is formed of an N+-type polycrystalline silicon film of the second layer. The first grounding wiring is connected to the N+-type diffused layers, which are the respective source regions of the first and second driver transistors, via the connecting holes which reach the respective N+-type diffused layers that are the source regions of the first and the second driver transistors. The source regions of the first and the second driver transistors are made common to the source region of the second driver transistor for the bit (m+1, n) and the source region of the first driver transistor for the bit (m−1, n), respectively. Because of this, the above-mentioned two connecting holes are provided on the boundary of the region for the bit (m+1, n) and the region for the bit (m,n), and on the boundary of the region for the bit (m,n) and the region for the bit (m−1, n), respectively. The first grounding wiring extends to the region for the bit (m−1, n) in the vicinity of the connecting hole that reaches the N+-type diffused layer which is the source region of the second driver transistor of the (m,n) bit. Similarly, the first grounding wiring extends to the region of the (m+1, n) bit in the vicinity of the connecting hole that reaches the N+-type diffused layer which is the source region of the first transistor for the bit (m,n), and extends in the direction that includes the boundary of the region for the bit (m, n-1) and the region for the bit (m−1, n−1). From these facts, the first grounding wiring for the bits belonging to the (n−1)-th row and for the bits belonging to the n-th row is common to both. Similarly, the first grounding wiring for the bits belonging to the (n+1)-th row and for the bits belonging to the (n+2)-th row is common to both. A P+-type diffused region which is the source region's and the power supply wirings of the first and the second TFTs, and the P+-type diffused regions which are the respective channel regions of the first and the second TFTs, and the respective drain regions of the first and the second TFTs are formed by a third layer of polycrystalline silicon film. The P+-type diffused region which is the drain region of the first TFT is connected to the N+-type diffused layer which is the source region of the first access transistor and the gate electrode of the second driver transistor via the connecting holes that reach the N+-type diffused layer which is the source region of the first access transistor and the gate electrode of the second driver transistor. Similarly, the P+-type diffused region which is the drain region of the second TFT is connected to the N+-type diffused layer which is the source region of the second access transistor and the gate electrode of the first driver transistor via the connecting holes that reach the N+-type diffused layer which is the source region of the second access transistor and the gate electrode of the first driver transistor. These two connecting holes are provided in the regions free from the first grounding wiring.

The respective gate electrodes of the first and the second TFTs are formed by a fourth layer of N+-type polycrystalline silicon film. The gate electrode of the first TFT is connected, via a connecting hole that reaches the N+-type diffused layer which is the sourde region of the second access transistor as well as the drain region of the second driver transistor, to this N+-type diffused layer. By so doing, the gate electrode of the first TFT becomes to be connected also to the gate electrode of the first driver transistor. The gate electrode of the second TFT is connected to the N+-type diffused layer which is the gate electrode as well as the drain region of the first driver transistor, via a connecting hole which reaches the N+-type diffused layer that is the gate electrode of the second driver transistor and the drain region of the first driver transistor. By so doing, the gate electrode of the second TFT becomes connected also to the N+-type diffused layer which is the source region of the first access transistor. These two connecting holes are formed in the regions free from the first grounding wiring. It should be noted that, for example, the reason for providing the connecting hole that connects the N+-type diffused layer which is the drain region of the second driver transistor and the P+-type diffused layer which is the drain region of the second TFT, and the connecting hole that connects the N+-type diffused layer which is the drain region of the second driver transistor and the gate electrode of the first TFT, at positions apart from each other, is to avoid the formation of an N-P-N junction.

The first and the second digit lines made of an aluminum film are connected to the N+-type diffused layer which are the drain regions of the first and the second access transistors, respectively, via the connecting holes that reach respectively the N+-type diffused layers that are the drain regions of the first and the second access transistors. These connecting holes are formed in the regions free from the first grounding wiring. The N+-type diffused layers which are the drain regions of the first and the second access transistors are also the drain regions of the first and the second access transistors, respectively, for the bit (m, n+1). In other words, the connecting holes that connect the respective digit lines and the drain regions of the access transistors at a bit belonging to the n-th row and at a bit belonging to the (n+1)-th row are common. Further, these connecting holes are provided in a line on the boundary of the region for the bits belonging to the n-th row and the region for the bits belonging to the (n+1)-th row. Similarly, the connecting holes that connect the digit lines and the drain regions of the access transistors are formed respectively in a line on the boundary between the region for the bits belonging to the (n−2)-th row and the region for the bits belonging to the (n−1)-th row, on the boundary between the region for the bits belonging to the (n+2)-th row and the region for the bits belonging to the (n+3)-th row, and the like.

Because of the above, the first grounding wiring cannot traverse the boundary between, for example, the region for the bits belonging to the n-th row and the region for the bits belonging to the (n+1)-th row. In deciding the region that is acceptable for providing the first grounding wiring it is necessary to consider, besides the connecting hole that connects the digit line and the drain region of the access transistor, a pair of CMOS inverters which consist of the first and the second driver transistors and the first and the second TFTs and the four connecting holes for constructing a flip-flop circuit out of these inverters. As a result, the first grounding wiring for this case has a ladderlike shape which extends in the direction approximately parallel to the word line.

As described in the above, the current that flows in the grounding wiring is larger than the current that flows in other wirings (namely, the digit line, the power supply wiring, and the word line) so that it is desirable that the first grounding wiring has a low resistance. This is particularly important in reading each bit. Suppose that the bit (m,n) the drain region of the first driver transistor is written at a High level and the drain region of the second driver transistor is written at a Low level. At this time, the word line of the n-th row is at Low and the first and the second digit lines of the m-th column are respectively at High. In order to read the state written as in the above the word line is made to go from Low to High, and the second digit line is made to go from High to Low. Since the second access transistor is energized at this time (note that the second driver transistor has been energized), there occurs a discharge from the second digit line through the first grounding wiring to the second grounding wiring made of an aluminum film. The change with time of this discharge is detected by a sense amplifier as the change with time of the potential difference between the first digit line and the second digit line. Because of this, if the resistance of the first grounding wiring is high, the apparent variation voltage from High to Low becomes small due to the voltage drop, and the change with time of the discharge is relaxed. That is to say, the sensitivity of detection by the sense amplifier is reduced. Moreover, if, for the same bit, the resistance of the first grounding wiring between the source region of the first driver transistor to the second grounding wiring is different from the resistance of the first grounding wiring between the source region of the second driver transistor and the second grounding wiring, the detection sensitivity of (High, Low) and the detection sensitivity of (Low, High) for the same bit become different.

The first grounding wiring formed of the second layer of polycrystalline silicon film is connected for every 16 bits, for example, to the low resistance second grounding wiring formed of an aluminum film. The second grounding wiring is provided in parallel with the digit line formed of an aluminum film. Assume that the resistances of the first grounding wiring between a connecting hole that connects the source region of the driver transistor and the first grounding wiring and the adjacent two connecting holes are all equal to R. The resistance of the first grounding wiring for the portion from this connecting hole provided on the boundary between the bit (m−1, n) and the bit (m,n) to the second grounding wiring formed of the aluminum film, becomes a function, R(m), of m. A simulation for the resistance value of the first grounding wiring with the above-mentioned shape under such an assumption produced a result that $R(1) = R(16) = 0.6R$, $R(2) = R(15) = 1.2R$, ..., $R(4) = R(13) = 1.9R$, $R(6) = R(11) = 2.2R$, and $R(8) = R(9) = 2.4R$. As is clear from this result, the detection sensitivity of read at the bit for $m = 8$ is markedly low compared with that at the bit for $m = 1$. In addition, the detection sensitivity for (Low, High) is reduced compared with the detection sensitivity for (High, Low) since $R(1)/R(2)$ is about $\frac{1}{2}$ at the bit for $m = 1$.

Accordingly, if the shape of the first grounding wiring formed of the second layer of polycrystalline silicon film is ladderlike, as was mentioned above, the resistance of the first grounding wiring for the portion from the specified connecting hole to the second grounding wiring formed of the aluminum film has a maximum range of variation of a factor of four. From this it follows that the detection sensitivity of read at the bit for $m = 8$ is lower than that at the bit for $m = 1$. Similarly, at the bit for $m = 16$, the detection sensitivity for (High, Low) becomes lower than the detection sensitivity for (Low, High). Furthermore, the potential for write at High level is specified by the voltage of the power supply, so that the problem of reduction in the detection sensitivity becomes a matter of grave concern when a power supply with low voltage is employed.

The TFT described in the aforementioned Japanese Laid Open Patent application is of the top gate type and the portion between the channel region of the first TFT and the gate electrode of the second driver transistor and the portion between the channel region of the second TFT and the gate electrode of the first driver transistor are almost shielded by the first grounding wiring formed of the second layer of polycrystalline silicon film. However, this shielding is not intentional, and it is difficult to completely shield the portion between the channel region of the first TFT and the gate electrode of the second driver transistor and the portion between the channel region of the second TFT and the gate electrode of the first driver transistor by the first grounding wiring without causing an increase in the cell size because there are required spacings between the connecting holes that connect the first and the second TFTs to the first and the second driver transistors and the first grounding wiring. Now, the P+-type diffused region which is the drain region of the first TFT and the gate electrode of the second driver transistor have the equal potential, and the P+-type diffused region which is the drain region of the second TFT and the gate electrode of the first driver transistor have the equal potential. In the portion where the above-mentioned shielding is absent, the channel region of a TFT is influenced (in inverse proportion to such things as the film thickness of the interlayer insulating film provided between the first layer of polycrystalline silicon film and the third layer of polycrystalline silicon film) by the potential of the drain region of the same TFT. In other words, the effective channel length of the TFT is reduced, and the leakage characteristic of the TFT is deteriorated (generating an increase in the leakage current at the off time of the TFT, an increase in the standby current of the SRAM, a reduction in the holding characteristic of the memory cell, and the like).

Differing from the case of the aforementioned Japanese Laid Open Patent application, in a TFT of the bottom gate type (for example, by forming a gate electrode using the third layer of polycrystalline silicon film and forming the source and the drain regions and the channel region using the fourth layer of polycrystalline silicon film), there is an advantage in making the channel length greater than the gate length, to improve the leakage characteristic by providing an off-set part by extending the channel gate from directly above the gate electrode in the direction of the drain region. Even in a memory cell which employs a P-channel type TFT of the bottom gate type as a load transistor, the first TFT, for example, is provided almost directly above the second driver transistor via an interlayer insulating film in order to comply with the demand for reduction of the cell size. When the shielding is absent for the portion between the off-set part of the channel region of the first TFT and the gate electrode of the second driver transistor, the above-mentioned influence becomes particularly conspicuous, depriving the advantage of the improvement of the leakage characteristic to a large extent.

BRIEF SUMMARY OF THE INVENTION

Objects of the Invention

It is an object of the invention to provide an SRAM having memory cells that have P-channel type TFTs as load elements.

It is an object of the invention to provide an SRAM having a memory cell suitable for miniaturization.

It is an object of the invention to provide an SRAM having an excellent detection sensitivity of read.

It is an object of the invention to provide an SRAM having small fluctuations of the detection sensitivity of read from one memory cell to another and within the same memory cell.

It is an object of the invention to provide an SRAM having memory cells with excellent in leakage characteristics.

SUMMARY OF THE INVENTION

According to the invention, in a semiconductor memory device in which a static memory cell is constituted of a first and a second load transistors consisting of a P-channel type TFT, first and second driver transistors consisting of an N-channel MOS transistor formed on the surface of a silicon substrate, first and second access transistors consisting of an N-channel MOS transistor formed on the surface of the silicon substrate, a word line, a first and second digit lines, power supply wiring, and a first grounding wiring, the gate electrodes of the first and the second driver transistors and the gate electrodes of the first and the second access transistors that also serve as word lines are formed of a first conductor film consisting of a material having melting point higher than that of aluminum, the first grounding wiring within the memory cell is formed of a second conductor film consisting of a material having melting point higher than that of aluminum, where the first grounding wiring being connected to a second grounding wiring formed of an aluminum film in a predetermined region outside of the memory cell, and the first and the second load transistors are formed of a third conductor film consisting of a material having melting point higher than that of aluminum and a fourth conductor film consisting of a material having melting point higher than that of aluminum, there is obtained a semiconductor memory device characterized in that the word line is branched within the memory cell to a first word line that is served also as the gate electrode of the first access transistor and a second word line that is served also as the gate electrode of the second access transistor and the first word line and the second word line are connected at a predetermined location outside the memory cell, and the first load transistor and the second load transistor, the first driver transistor and the second driver transistor, and the first access transistor and the second access transistor are respectively arranged at point symmetric positions with respect to the same reference point within the memory cell, and the first grounding wiring extends respectively in the direction parallel to the digit lines and in the direction parallel to the word line, forming a meshlike shape.

It is preferable that the grounding wirings are provided between the respective channel regions of the first and the second load transistors and the respective gate electrodes of the first and the second driver transistors. It is preferable that the first grounding wiring is formed of a high melting point metal or a silicide or a polycide. It is preferable that the third conductor film is an N-type polycrystalline silicon film, and forms the gate electrodes of the first and the second TFTs. It is preferable that the channel regions of the first and the second TFTs have the off-set parts that extend in the direction of the respective drain regions.

By disposing the first access transistor and the second access transistor at the locations that are point symmetric with respect to a reference point within the memory cell (the center of gravity of the memory cell), the connecting hole (first digit connecting hole) for the drain region of the first access transistor and the first digit line, and the connecting hole (second digit connecting hole) for the drain region of the second access transistor and the second digit line are arranged at locations point symmetric with respect to the center of gravity. Conventionally, the first digit connecting hole for the bit (m−1, n), the second digit connecting hole for the bit (m−1, n), the first digit connecting hole for the bit (m,n), the second digit connecting hole for the bit (m,n), the first digit connecting hole for the bit (m+1, n), and the second digit connecting hole for the bit (m+1, n), for example, are provided in a line on the boundary between the bits belonging to the n-th row and the bits belonging to the (n+1)-th row. Here, the first digit connecting hole for the bit (m−1, n), the first digit connecting hole for the bit (m,n), and the first digit connecting hole for the bit (m+1, n) are provided in a line on the boundary of the bits belonging to the n-th row and the bits belonging to the (n+1)-th row. Similarly, the second digit connecting hole for the bit (m−1, n), the second digit connecting hole for the bit (m,n), and the second digit connecting hole for the bit (m+1, n) are provided in a line on the boundary of the bits belonging to the (n−1)-th row and the bits belonging to the n-th row. Because of this, the spacing between the two strings of the digit connecting lines that are respectively arranged in a line can be made large without increasing the cell size, and it becomes possible to provide the first grounding wiring in the space between the lines of digit connecting holes. A plurality of connecting holes for obtaining a pair of CMOS inverters formed by a pair of driver transistors and a pair of load transistors consisting of a TFT and flip-flop coupling of the pair of CMOS inverters, can respectively be arranged distributed in a similar manner in the vicinity of the first digit connecting holes and the second digit connecting holes in point symmetry with respect to the center of the gravity.

As a result, the first grounding wiring has a mesh-like form, the resistance of the first grounding wiring from the bits to the second grounding wiring becoming low, and the difference between this resistance and the resistance of the first grounding wiring from the bits to the second grounding wiring also becoming low. For this reason, the detection sensitivity of read can be improved in spite of the ease of reduction of the cell sizes by use of the TFT type memory cells. The difference in the detection sensitivity of read between the memory cells and within the same memory cell becomes small.

Moreover, the restriction due to the spacings between the plurality of kinds of connecting holes for the formation of the CMOS inverters and their flip-flop coupling and the first grounding wiring can be relaxed, and it becomes possible to shield the respective spaces between the channel regions of the first and the second load transistors consisting of the TFT and the gate electrodes of the first and the second driver transistors with the first grounding wiring. By so doing, the leakage characteristic of the TFT can be improved and an SRAM having memory cells with excellent leakage characteristic can be realized.

BRIEF DESCRIPTION OF THE DRAWINGS

The above-mentioned and other object, features, and advantages of this invention will become apparent by reference to the following detailed description of the invention taken in conjunction with the accompanying drawings, wherein.

DETAILED DESCRIPTION OF THE EMBODIMENT

Figure 1:
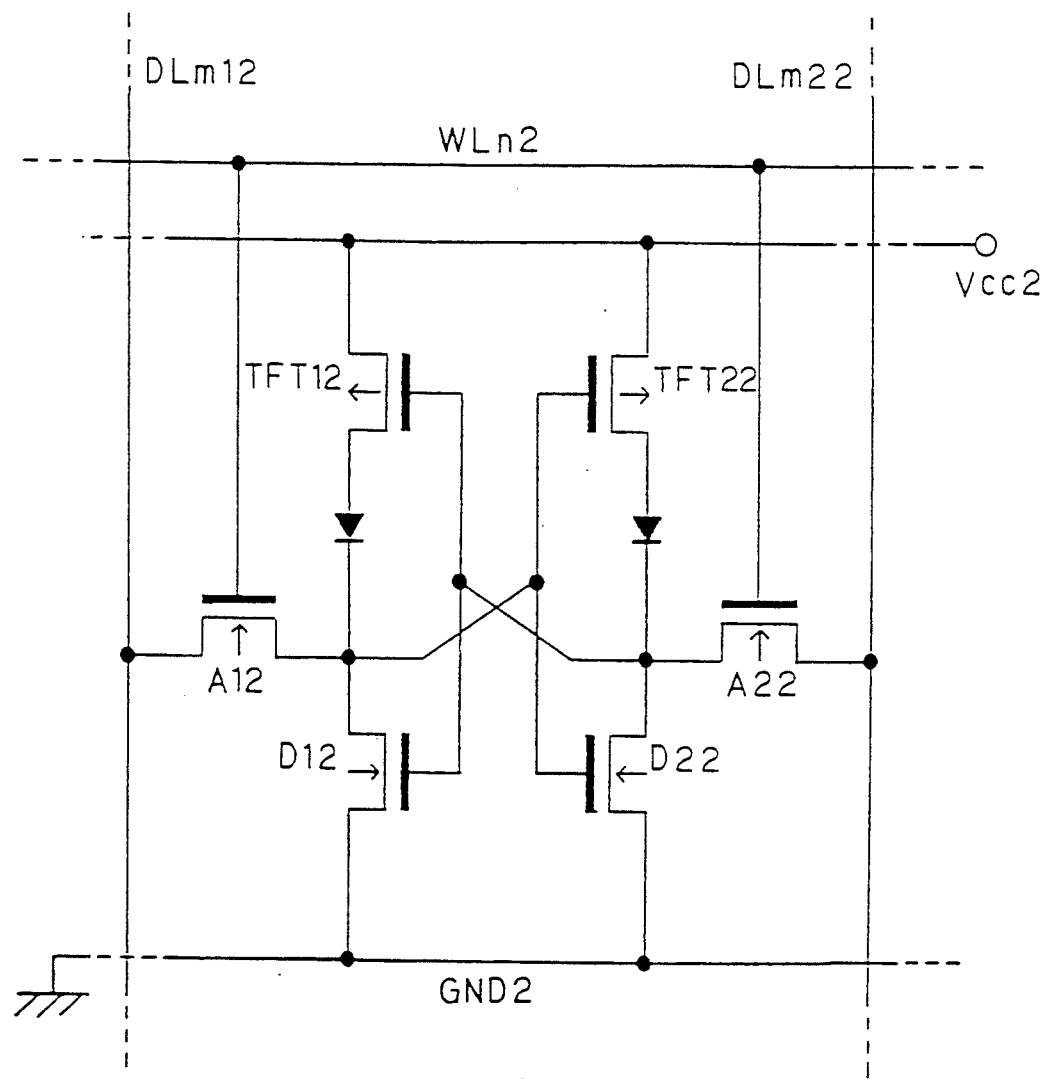
FIG. 1 is an equivalent circuit diagram for the memory cell for the bit (m,n) of the conventional SRAM.

Prior to the description of this invention, the conventional SRAM, and its problems, having TFT memory cells will be described first by referring to the drawings.

FIG. 1 shows an equivalent circuit diagram for the memory cell for the bit (m,n) of the SRAM, the circuit constitution of the memory cell of the SRAM disclosed in Japanese Laid Open Patent application No. 202858-1989 is shown below. The memory cell for the bit (m,n) is constituted of a first access transistor (A12) and a second access transistor (A22) consisting of an N-channel MOS transistor, a first driver transistor (D12) and a second driver transistor (D22) consisting of an N-channel MOS transistor, the P-channel type first TFT (TFT12) and second TFT (TFT22) which are load transistors, a first digit line (DLm12) and a second digit line (DLm22) of the m-th column, a word line (WLn2) of the n-th row, a power supply wiring (Vcc2), and a grounding wiring (GND2). The line WLn2 is connected to the respective gate electrodes of A12 and A22, and DLm12 and DLm22 are connected to the respective drain regions of A12 and A22. A first CMOS inverter is constructed by TFT12 and D12, a second CMOS inverter is constructed by TFT22 and D22, and the first CMOS inverter and the second CMOS inverter are coupled to form a flip-flop circuit. The wiring Vcc2 is connected to the respective source regions of TFT12 and TFT22, and the wiring GND2 is connected to the respective source regions of D12 and D22. The source region of A12 is connected to the drain region of D12, and the source region of A22 is connected to the drain region of D22. Between the drain region of TFT12 and the drain region of D12, and between the drain region of TFT22 and the drain region of D22, there are formed respectively diodes by P-N junction.

Figures 2A, 2B:
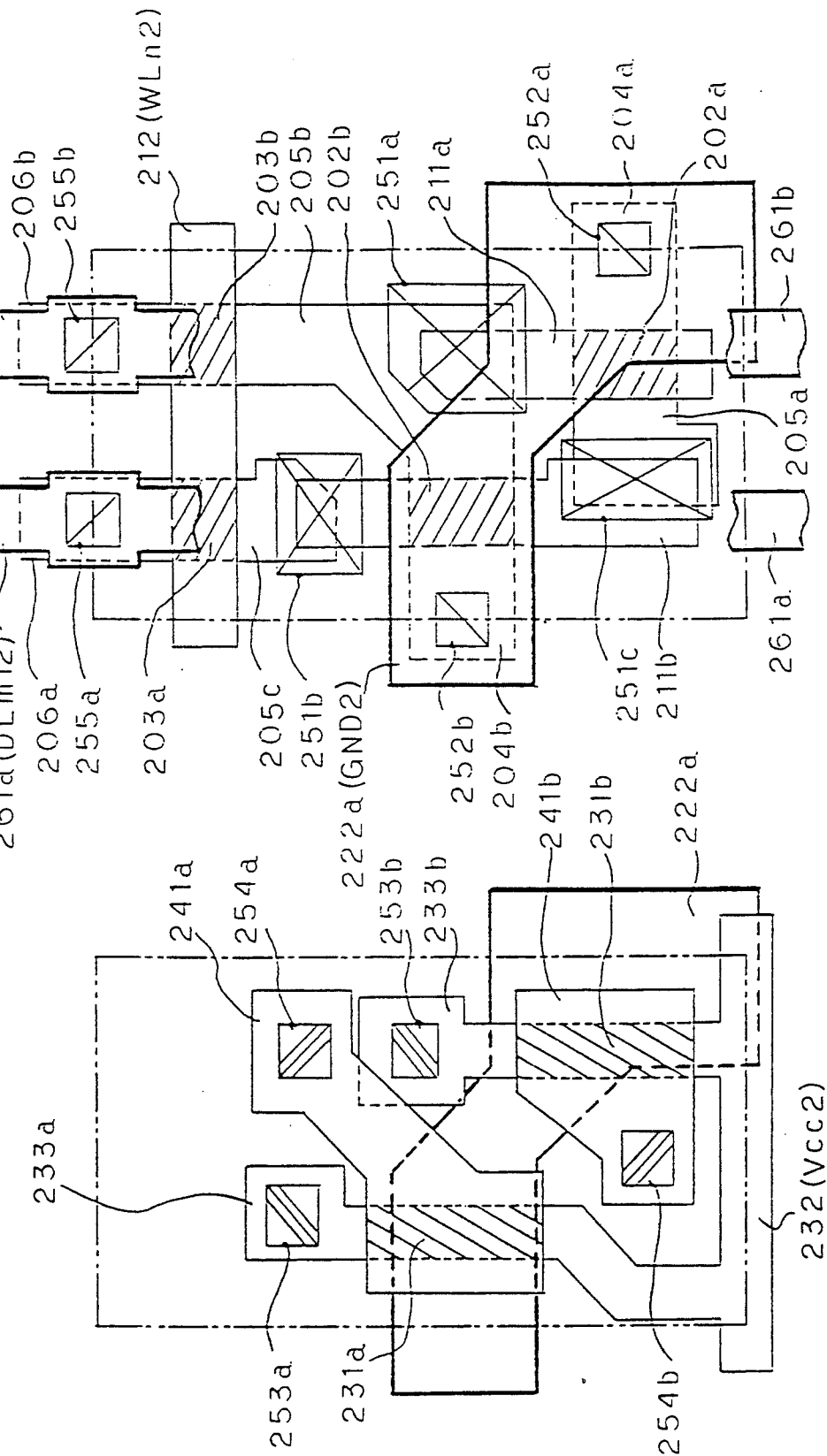
FIGS. 2A and 2B are schematic plan views for describing the memory cell for the bit (m,n) of the conventional SRAM.

Referring to schematic plan views, FIGS. 2A and 2B, for describing the memory cell for the bit (m,n) of SRAM, the device structure of the memory cell of the SRAM disclosed in Japanese Laid Open Patent application No. 202858-1989 is as described in what follows. The transistors D12, D22, A12 and A22 are formed on the surface of the respective P-type regions of a silicon substrate (not shown). Using a first layer of N+-type polycrystalline silicon film, the respective gate electrodes 211a and 211b of D12 and D22, and a word line 212 which is WLn2 are formed. The word line 212 is served also as the respective gate electrodes of A12 and A22. An N+-type diffused layer 205c which is the source region of A12 and an N+-type diffused layer 205a which is the drain region of D12 are connected by a gate electrode 211b via a connecting hole 251b (direct contact hole) that reaches the N+-type diffused layer 205c, and a connecting hole 251c (direct contact hole) that reaches the N+-type diffused layer 205a. The source region of A22 and the drain region of D22 are formed of the same N+-type diffused layer 205b. The gate electrode 211a is connected to the N+-type diffused layer 205b via a connecting hole 251a (direct contact hole) that reaches the N+-type diffused layer 205b.

By a second layer of N+-type polycrystalline silicon film, a first grounding wiring 222a which is GND2 within the memory cell is formed. The grounding wiring 222a is connected to the respective N+-type diffused layers 204a and 204b via the connecting holes 252a and 252b that reach the N+-type diffused layers 204a and 204b which are the source regions of D12 and D22. Sandwiched by the N+-type diffused layer 204a and the N+-type diffused layer 205a, and on the surface of the silicon substrate directly below, via a gate insulating film (not shown), there is formed the channel region 202a (the portion with hatches sloping down toward the right in FIG. 2A) of D12. Similarly, sandwiched by the N+-type diffused layer 204b and the N+-type diffused layer 205b, and on the surface of the silicon substrate directly below the gate electrode 211b, via the gate insulating film (not shown), there is formed the channel region 202b (the portion with hatches sloping down toward right in FIG. 2A) of D22.

By a third layer of polycrystalline silicon film, a P+-type diffused region 232 which are the source regions of TFT12 and TFT22 and also is Vcc2, the respective channel regions 231a and 231b (the portions with hatches sloping down toward the left in FIG. 2B) of TFT12 and TFT22, and the respective P+-type diffused regions 233a and 233b which are drain regions of TFT12 and TFT22, are formed. The P+-type diffused region 233a is connected to the N+-type diffused layer 205c and the gate electrode 211b via a connecting hole 253a that reaches the N+-type diffused layer 205c and the gate electrode 211b. Similarly, the P+-type diffused region 233b is connected to the N+-type diffused layer 205b and the gate electrode 211a via a connecting hole 253b which reaches the N+-type diffused layer 205b and the gate electrode 211a. These two connecting holes 253a and 253b are provided in a region free from the first grounding terminal 222a.

By a fourth layer of N+-type polycrystalline silicon film, the gate electrodes 241a and 241b of TFT12 and TFT22 are formed. The gate electrode 241a is connected to the N+-type diffused layer 205b via a connecting hole 254a that reaches the N+-type diffused layer 205b. By so doing, the gate electrode 241a becomes to be connected also to the gate electrode 211a. The gate electrode 241b is connected to the gate electrode 211b and the N+-type diffused layer 205a via a connecting hole 254b that reaches the gate electrode 211b and the N+-type diffused layer 205a. By so doing, the gate electrode 241b is connected also to the N+-type diffused layer 205c. These two connecting holes 254a and 254b are provided in a region free from the first grounding wiring 222a. It should be noted that the reason for providing the connecting hole 253b at a position apart from the connecting hole 254a, for example, is to avoid the formation of an N-P-N junction.

A digit line 261a consisting of an aluminum film (DLm12), and a digit line 261b consisting of an aluminum film (DLm22) are connected to N+-type diffused layers 206a and 206b, respectively, via connecting holes 255a and 255b that reach the N+-type diffused layers 206a and 206b of A12 and A22, respectively. These connecting holes 255a and 255b are provided in a region free from the first grounding wiring 222. Sandwiched by the N+-type diffused layer 205c and the N+-type diffused layer 206a, and on the surface of the silicon substrate directly below a word line 212 via the gate insulating film (not shown), there is formed the channel region 203a (the portion with hatches sloping down toward the right in FIG. 2A) of A12. Similarly, sandwiched by the N+-type diffused layer 205b and the N+-type diffused layer 206b, and on the surface of the silicon substrate directly below the word line 212 via the gate electrode (not shown), there is formed the channel region 203b (a portion with hatches sloping down toward the right) of A22.

Figure 3:
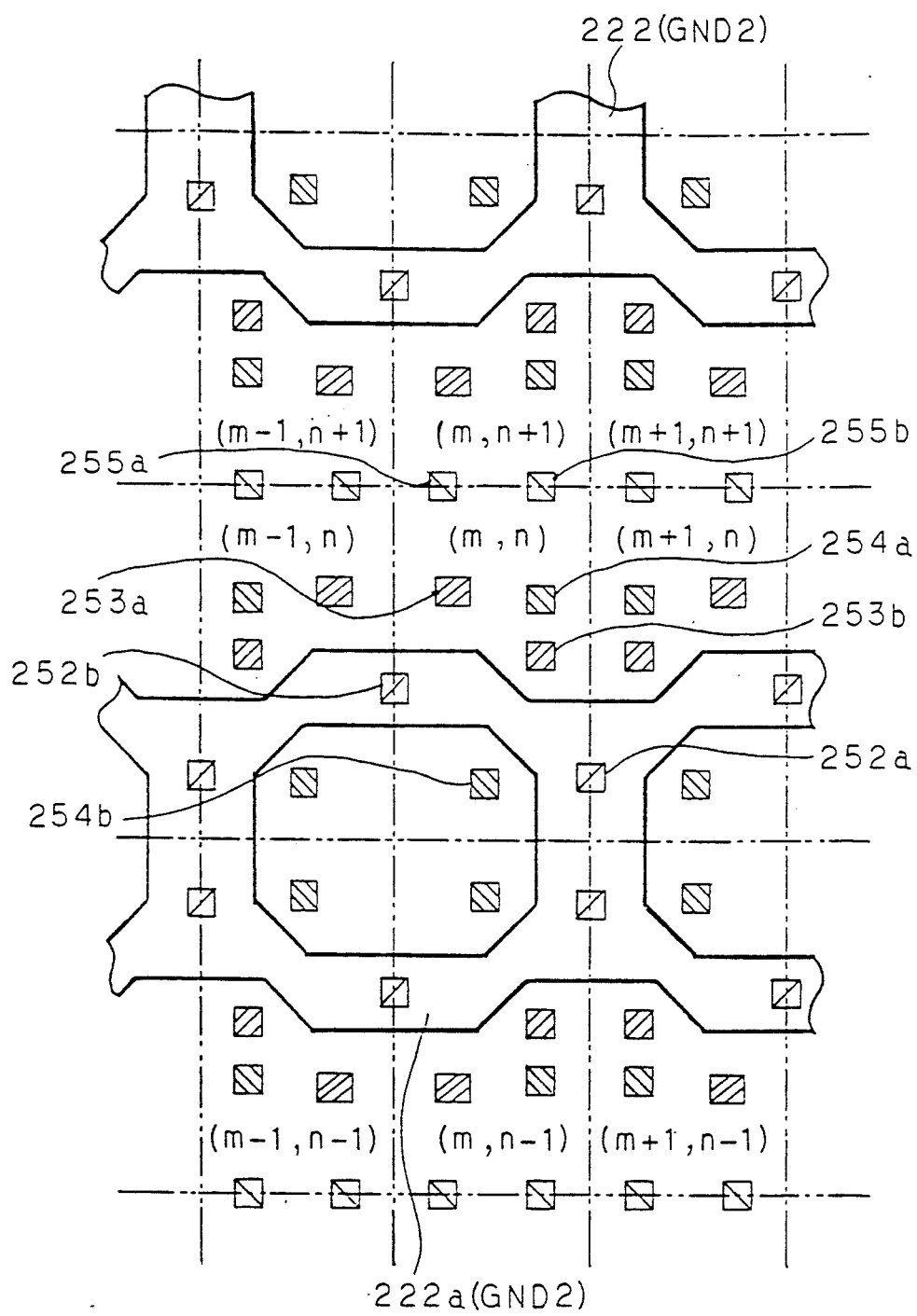
FIG. 3 is a schematic plan view for describing the form of the grounding wiring of the conventional SRAM.

Referring also to FIG. 3 which is a schematic plan view, the shape of the first grounding wiring that straddles a plurality of memory cells that are adjacent with each other, and the positional relationship between the first grounding wiring and the various kinds of connecting holes in the SRAM disclosed in the aforementioned Japanese Laid Open Patent application are as follows The N+-type diffused layers 204a and 204b are common to the source region of the second driver transistor for the bit (m+1, n) and the source region of the first driver transistor for the bit (m−1, n), respectively. Because of this, the connecting holes 252b and 252a are provided on the boundary of the region for the bit (m−1, n) and the region for the bit (m,n) and on the boundary of the region for the bit (m,n) and the region for the bit (m+1, n), respectively. In the vicinity of the connecting hole 252b, the grounding wiring 222a extends to the region of the bit (m−1, n). Similarly, in the vicinity of the connecting hole 252a, the grounding wiring 222a extends to the region for the bit (m+1, n), and also extends in the direction that includes the boundary between the region for the bit (m, n−1) and the region for the bit (m+1, n−1). From these facts, the first grounding wiring in the region for the bits belonging to the (n−1)-th row and the region for the bits belonging to the n-th row becomes the grounding wiring 222a. Similarly, the first grounding wiring in the region for the bits belonging to the (n+1)-th row and the region for the bits belonging to the (n+2)-th row becomes the grounding wiring 222.

The N+-type diffused layers 206a and 206b which are the drain regions of A12 and A22 are also the drain regions of the first and the second access transistors, respectively, for the bit (m, n+1). That is to say, the connecting holes that connect the respective digit lines and the drain regions of the respective access transistors for the bits belonging to the n-th row and the bits belonging to the (n+1)-th bit are con, non. Further, these connecting holes are provided in a line on the boundary between the region for the bits belonging to the n-th row and the region for the bits belonging to the (n+1)-th row. Similarly, the connecting holes that connect the digit lines and the drain regions of the access transistors are respectively provided on the boundary between the region for the bits belonging to the (n-2)-th row and the region for the bits belonging to the (n-1)-th row, on the boundary between the region for the bits belonging to the (n+2)-th row and the region for the bits belonging.

Because of the above, the grounding wiring 222a cannot traverse, for example, the boundary between the region for the bits belonging to the n-th row and the region for the bits belonging to the (n+1)-th row so that it will not be connected directly to the grounding wiring 222. For the determination of a region which will not interfere with the formation of the first grounding wiring, it is necessary to consider, besides the connecting holes (for example, the connecting holes 255a and 255b) that connect the digit line and the drain regions of the access transistors, a pair of CMOS inverters consisting of the first and the second driver transistors and the first and the second TFTs and the four connecting holes (the connecting holes 253a, 253b, 254a, and 254b, or the like) needed for the construction of the flip-flop coupling. As a result, the first grounding wiring in this case has a ladderlike shape which extend in the direction approximately parallel to the word line.

Figure 4A:
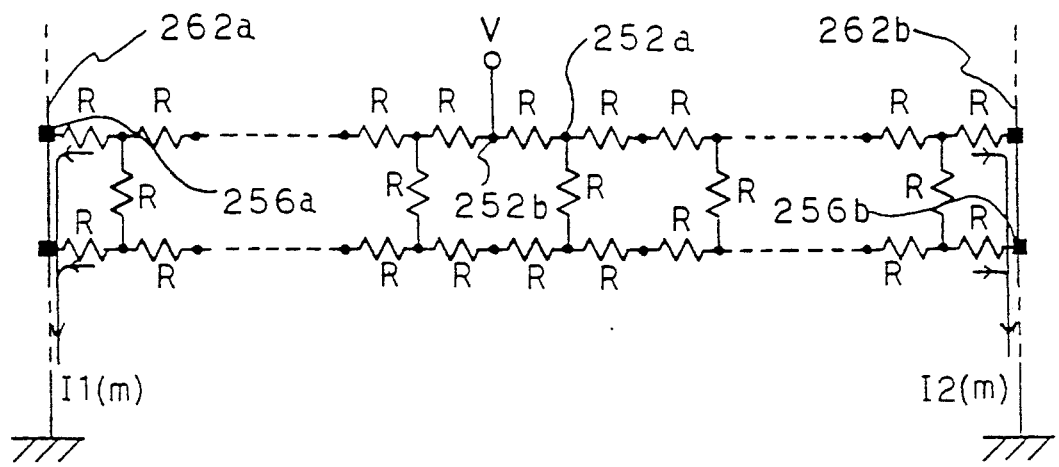
FIG. 4A is a schematic diagram showing the model of a simulation for describing the problems of the grounding wiring of the conventional SRAM.
Figure 4B:
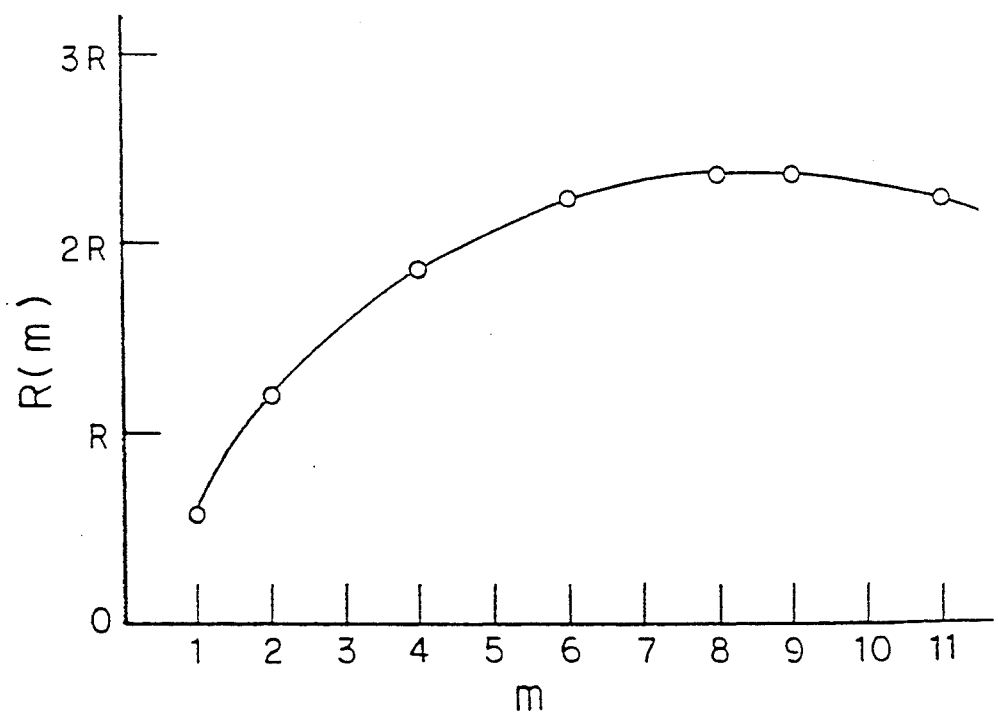
FIG. 4B is a graph showing the result of the simulation.

Referring to FIG. 4A for describing the model of a simulation and FIG. 4B which is the graph showing the result of the simulation, the bit dependence of the resistance value of the grounding wiring in the SRAM disclosed in the aforementioned Japanese Laid Open Patent application is described below.

The first grounding wiring 222a formed by the second layer of polycrystalline silicon film is connected for every 16 bits, for example, to low resistance second grounding wirings 262a and 262b consisting of aluminum films via a connecting hole 256a and a connecting hole 256b. The second grounding wirings 262a and 262b are provided in parallel with the digit line formed of an aluminum film. It will be assumed that the resistances of the first grounding wiring between the two adjacent connecting holes at a connecting hole that connects the source region of the driver transistor and the first grounding wiring are all equal to R [FIG. 4A]. The resistance value of the first grounding wiring from a connecting hole 252b provided on the boundary of the bit (m−1, n) and the bit (m,n) to the second grounding wirings 262a and 262b that consist of aluminum films becomes a function of m, namely, R(m). This can be obtained from the sum of the current I1(m) that flows in the second grounding wiring 262a and the current I2(m) that flows in the second grounding wiring when a voltage V is applied to the connecting hole 252b. The result of the simulation is shown in FIG. 4B. It was found that R(1)=R(16)=0.6R, R(2)=R(15)=1.2R, . . . , R(4)=R(13)=1.9R, R(6)=R(11)=2.2R, and R(8)=R(9)=2.4R, showing the difference with a maximum factor of four.

Next, referring to the drawings, the invention will be described.

Figure 5:
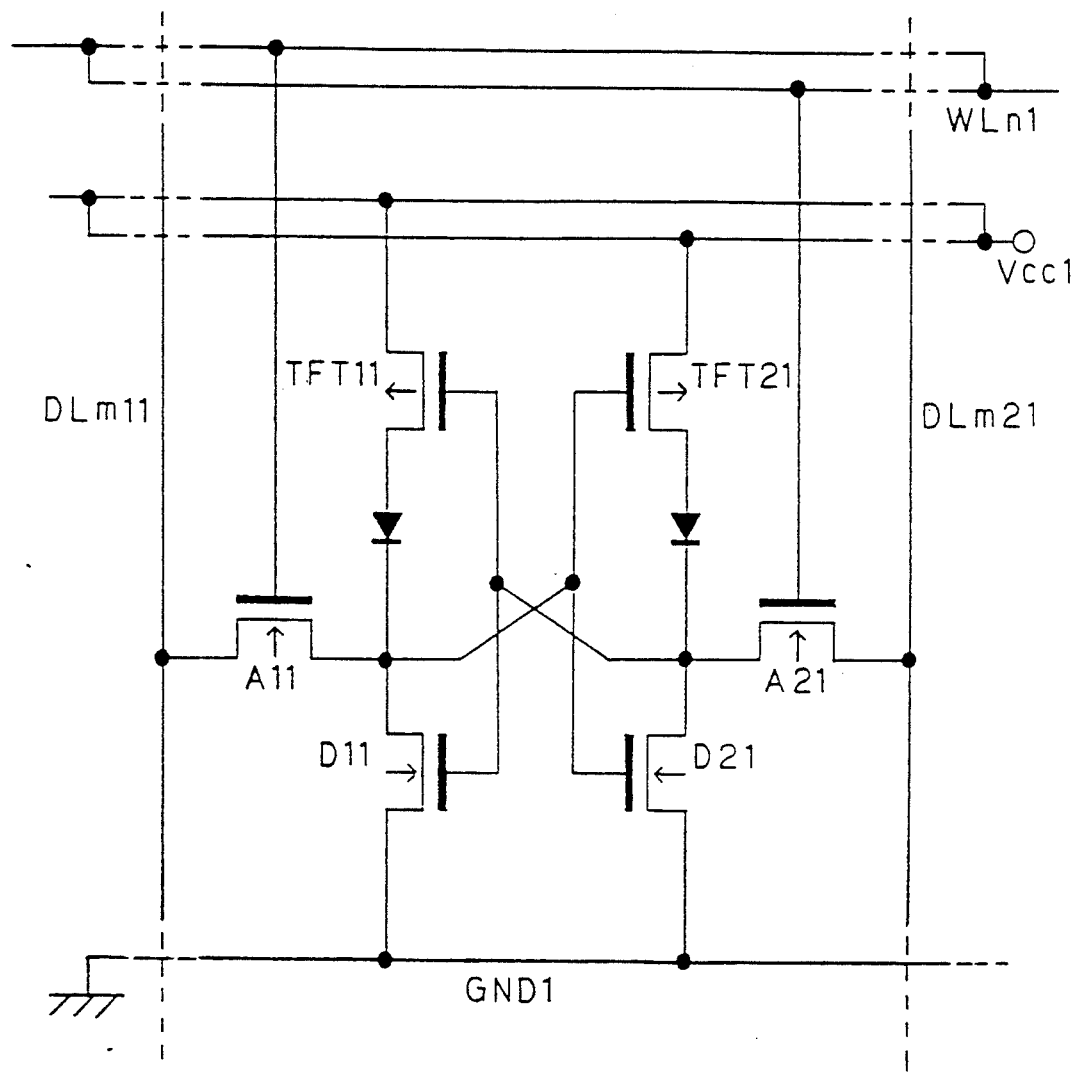
FIG. 5 is an equivalent circuit diagram for the memory cell for the bit (m,n) of an embodiment of SRAM of this invention.

Referring to FIG. 5 which shows an equivalent circuit diagram for the (m,n) bit memory cell of the SRAM, the circuit constitution of the memory cell of one embodiment of SRAM according to this invention is as follows. The memory cell for the bit (m,n) is constituted of a first access transistor (A11) and a second access transistor (A21) consisting of an N-channel MOS transistor, a first driver transistor (D11) and a second driver transistor (D21) consisting of an N-channel MOS transistor, P-channel type first TFT (TFT11) and second TFT (TFT21) which are load transistors, a first digit line (DLm11) and a second digit line (DLm21) of the m-th column, a word line of the n-th row (WLn1) which is branched out into two parts within the memory cell, a power supply wiring (Vcc1) which is branched out into two parts within the memory cell, and a grounding wiring (GND1). The respective members of the branched WLn1 are connected to the respective gate electrodes of A11 and A21, and DLm11 and DLm21 are connected to the drain regions of A11 and A21. A first CMOS inverter is formed by TFT11 and D11, a second CMOS inverter is formed by TFT21 and D21, and the first CMOS inverter and the second CMOS inverter are coupled to form a flip-flop circuit. The respective members of Vcc1 branched into two parts are connected to the respective source regions of TFT11 and TFT21, and GND1 is connected to the respective source regions of D11 and D21. The source region of A11 is connected to the drain region of D11, and the source region of A21 is connected to the drain region of D21. Between the drain region of TFT11 and the drain region of D11, and between the drain region of TFT21 and the drain region of D21 there are formed respective diodes of P-N junction.

Figure 6:
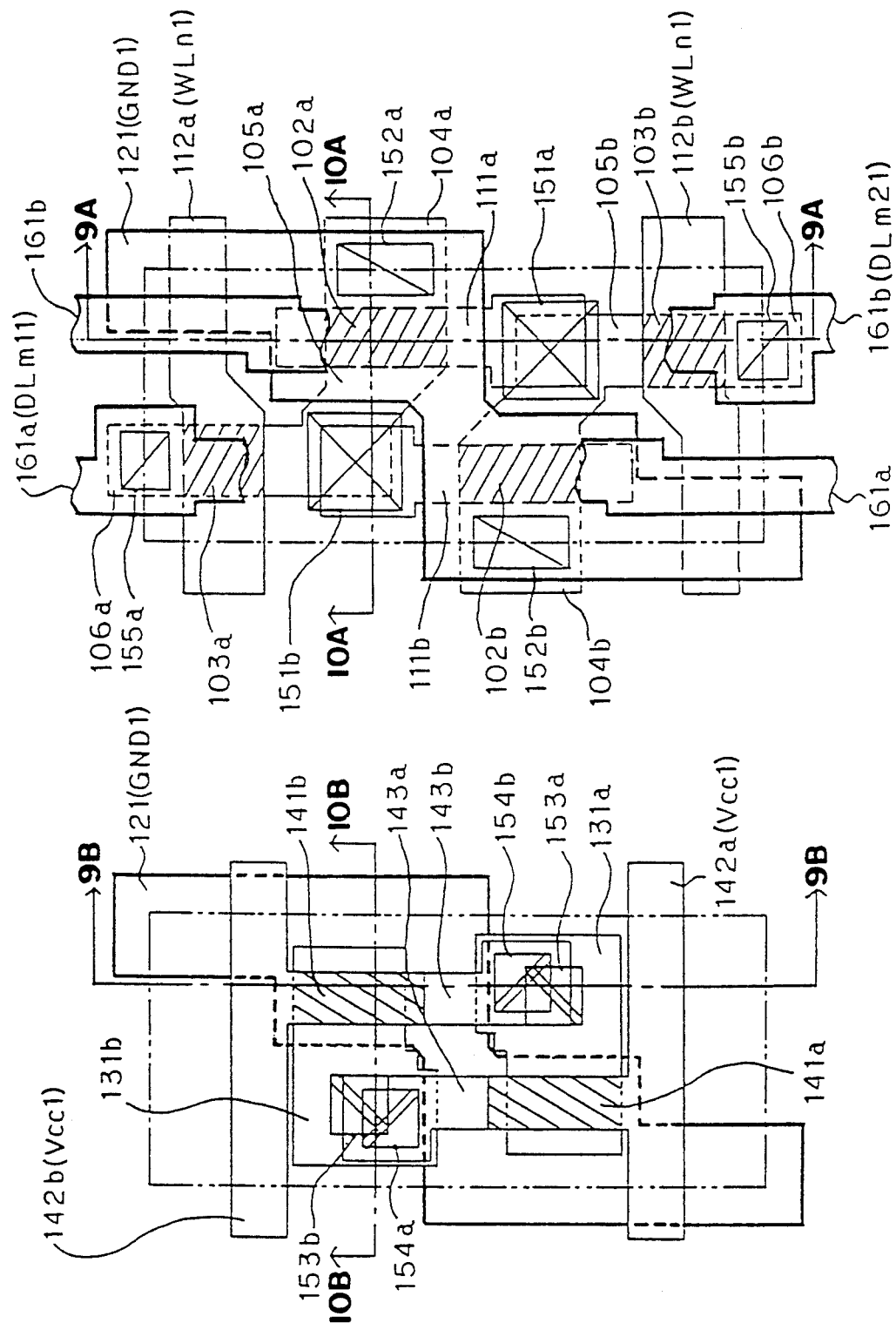
FIG. 6A and 6B are schematic plan views for describing the memory cell for the bit (m,n) of SRAM of the embodiment.

Referring to FIGS. 6A and 6B which are schematic plan views for describing the memory cell for the bit (m,n) of the SRAM, the device structure of the memory cell for the SRAM of the embodiment is as described below. The transistors A11, A21, D11, and D21 are formed on the respective P-type silicon substrate. Using a tungsten polycide film as a first layer of conductor film consisting of a material with melting point higher than that of aluminum, the respective gate electrodes 111a and 111b of D11 and D21, and word lines 112a and 112b which constitute WLn1 are formed. The word lines 112a and 112b serve also as the respective gate electrodes of A11 and A21. The gate electrode 111b is connected to the N+-type diffused layer 105a via a connecting hole 151b (direct contact hole) which is the source region A11, and reaches the N+-type diffused layer 105a that is the drain region of D11. The gate electrode 111a is connected to the N+-type diffused layer 105b via a connecting hole 151a (direct contact hole) which is the source region of A21, and reaches the N+-type diffused layer 105b that is the drain region of D21.

Using a tungsten silicide film which is a second layer of conductor film consisting of a material with melting point higher than that of aluminum, a first grounding wiring 121 which is GND1 within the memory cell is formed. The grounding wiring 121 is connected to the respective N+-type diffused layers 104a and 104b via connecting holes 152a and 152b which reach the respective N+-type diffused layers 104a and 104b that are the source regions of D11 and D21. The channel region 102a (a portion with hatches sloping down toward the right in FIG. 6A) is formed on the surface of the silicon substrate, via a first gate oxide film (described later), directly below the gate electrode 111a, sandwiched by the N+-type diffused layer 104a and an N+-type diffused layer 105a. Similarly, the channel region 102b (a portion with hatches sloping down toward the right in FIG. 6A) is formed on the surface of the silicon substrate, via the first gate oxide film (to be described later), directly below the gate electrode 111b, sandwiched by the N+-type diffused layer 104b and the N+-type diffused layer 105b.

Using an N+-type polycrystalline silicon film which is a third layer of conductor film consisting of a material with melting point higher than that of aluminum, the gate electrodes 131a and 131b of TFT11 and TFT21 are formed. The gate electrode 131a is connected to an N+-type diffused layer 105b and the gate electrode 111a via a connecting hole 153a. The gate electrode 131b is connected to an N+-type diffused layer 105a and the gate electrode 111b via a connecting hole 153b.

Using a polycrystalline silicon film which is a fourth layer of conductor film consisting of a material with melting point higher than that of aluminum, the P+-type diffused regions 142a and 142b which are the source regions of TFT11 and TFT21, respectively, and is also Vcc1, the respective channel regions 141a and 141b (a portions with hatches sloping down toward the left in FIG. 6B) of TFT11 and TFT21, and the respective P+-type diffused regions 143a and 143b which are the drain regions of TFT11 and TFT21 are formed. Since TFT11 and TFT21 are transistors of the bottom gate type, it is easy to provide an off-set part in the channel regions 141a and 141b so that it is possible to improve the leakage characteristic by making the channel length of TFT greater than the gate length. The P+-type diffused region 143a is connected to the N+-type diffused layer 105a, the gate electrode 111b, and the gate electrode 131b via a connecting hole 154a. Similarly, the P+-type diffused region 143b is connected to the N+-type diffused layer 105b, the gate electrode 111a, and the gate electrode 131a via a connecting hole 154b. Since the two connecting holes 143a and 143b are such that they reach the gate electrodes 131b and 131a, respectively, the selection of the locations for providing these two connecting holes 143a and 143b is not affected by the presence of the first grounding wiring 121.

A digit line 161a consisting of an aluminum film and is the line DLm1 and a digit line 161b consisting of an aluminum film and is the line DLm21 are connected to the N+-type diffused layers 106a and 106b, respectively, via the connecting holes 155a and 155b that reach the N+-type diffused layers 106a and 106b, respectively, of A11 and A21. These connecting holes 155a and 155b are provided in the regions free from the first grounding wiring 121. The channel region 103a (a portion with hatches sloping down toward the right in FIG. 6A) is formed on the surface of the silicon substrate directly below the word line 112a via the first gate oxide film (to be described later), sandwiched by the N+-type diffused layer 105a and the N+-type diffused layer 106a. Similarly, the channel region 103b (a portion with hatches sloping down toward the right in FIG. 6A) is formed on the surface of the silicon substrate directly below the word line 112b via the first gate oxide film (to be described later), sandwiched by the N+-type diffused layer 105b and the N+-type diffused layer 106b.

As is clear from the description above, A11 and A21, D11 and D21, TFT11 and TFT21, and DLm11 and DLm21 in this embodiment are respectively arranged in point symmetry with respect to the center of gravity of the memory cell. In addition, WLn1 and Vcc1 that are branched into two lines within the memory cell are also arranged in point symmetry with respect to the center of gravity of the memory cell. The situation is analogous to the connecting hole 151a and the connecting hole 151b, the connecting hole 152a and the connecting hole 152b, the connecting hole 153a and the connecting hole 153b, the connecting hole 154a and the connecting hole 154b, and the connecting hole 155a and the connecting hole 155b. A CMOS memory cell possessing symmetry is disclosed in U.S. Pat. No. 5,072,286 (issued Dec. 10, 1991) Japanese Laid Open Patent application No. 114256-1991 (published May 15, 1991)). The invention disclosed in the above-mentioned publication improves the noise margin by such procedure as equalizing the parasitic capacitances in a first node (the drain region of the first driver transistor) and a second node (the drain region of the second driver transistor) for storage of information by symmetrizing the components within the memory cell. The invention in the present application is based on the technical concept of the invention disclosed in the above-mentioned publication. However, what this invention is aiming at is to obtain a new effect which was not possible by the invention disclosed in the above-mentioned publication by a new technical concept.

Figure 7:
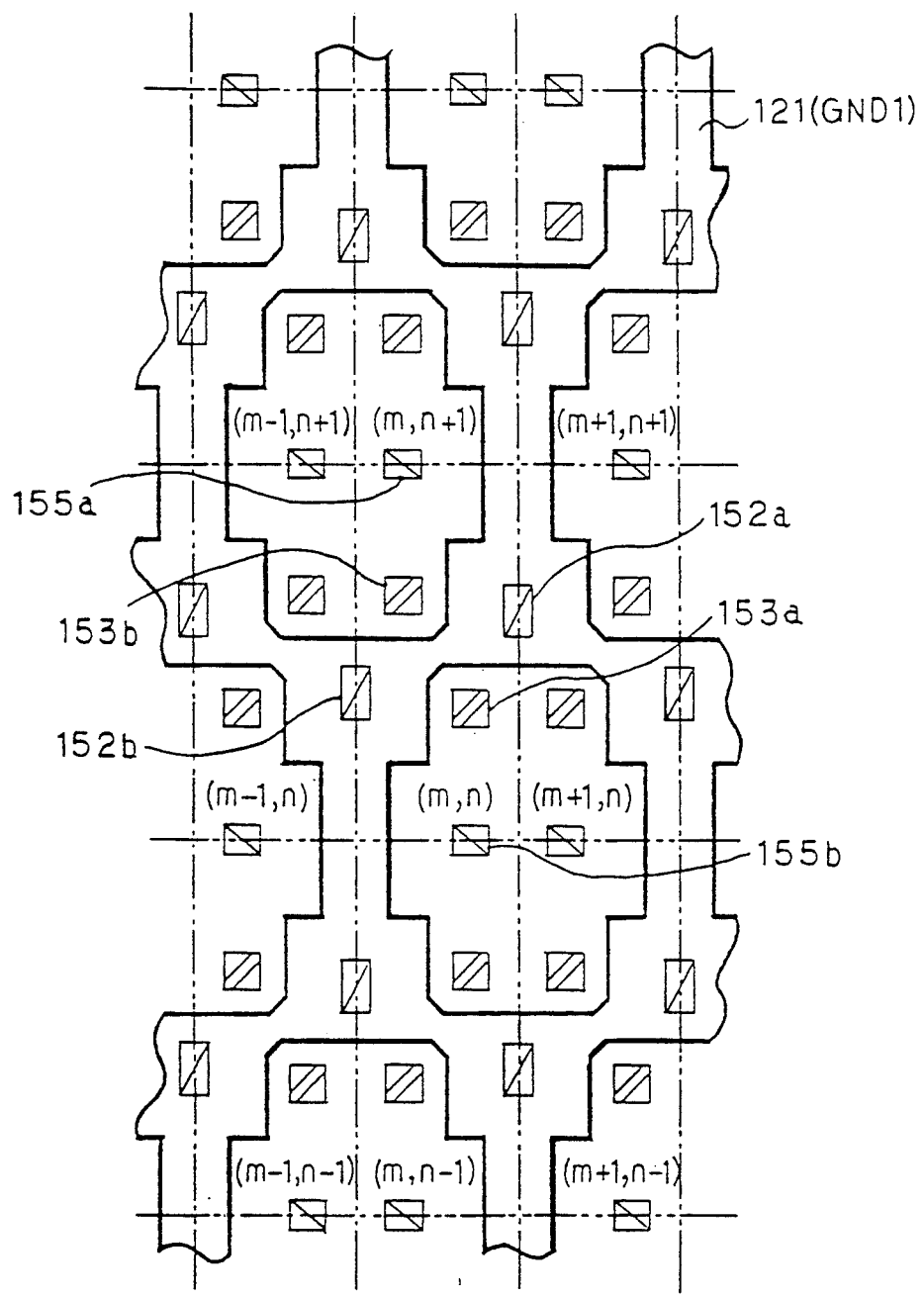
FIG. 7 is a schematic plan view for describing the form of the grounding wiring of SRAM of the embodiment.

Referring also to FIG. 7 which is a schematic plan view, the shape of the first grounding wiring that straddles a plurality of mutually adjacent memory cells and the positional relationship between the first grounding wiring and the various kinds of connecting holes in the SRAM of this embodiment are as described below.

The N+-type diffused layers 104a and 104b are common to the source region of the second driver transistor for the bit (m+1, n) and the source region of the first driver transistor for the bit (m−1, n), respectively. Because of this, the two connecting holes 152b and 152a are provided on the boundary between the bit (m−1, n) and the bit (m,n) and the boundary between the bit (m,n) and the bit (m+1, n), respectively. In the vicinity of the connecting hole 152b, the grounding wiring 121 extends to the bit (m−1, n). Similarly, in the vicinity of the connecting hole 152a, the grounding wiring 121 extends to the bit (m+1, n).

The N+-type diffused layers 106a and 106b which are the drain regions of A11 and A21 are also the drain region of the first access transistor for the bit (m, n+1) and the drain region of the second access transistor for the bit (m, n−1), respectively. Focusing the attention on the connecting holes for the drain regions of the access transistors for bits belonging to the n-th row and digit lines, the following can be observed. Namely, on the boundary between the bits belonging to the (n+1)-th row and the bits belonging to the n-th row, there are provided the connecting hole for the drain region of the second access transistor for the bit (m−1, n) and the second digit line, the connecting hole 155a (which is the connecting hole for the drain region of the first access transistor (A11) and the first digit line (DLm11)), the connecting hole for the drain region of the second access transistor for the bit (m−1, n) and the first digit line, and the like. Similarly, on the boundary between the bits belonging to the n-th row and the bits belonging to the (n−1)-th row, there are provided the connecting hole for the drain region of the first access transistor for the bit (m−1, n) and the first digit line, the connecting hole 155b (which is the connecting hole for the drain region of the second access transistor (A21) and the second digit line (DLm21)), the connecting hole for the drain region of the second access transistor for the bit (m−1, n) and the first digit line, and the like. The spacing between the connecting hole 155a and the connecting hole for the drain region of the second access transistor for the bit (m−1, n) and the second digit line, and the spacing between the connecting hole 155b and the connecting hole for the drain region of the first access transistor for the bit (m−1, n) and the first digit line, are enlarged.

Furthermore, of the two kinds of connecting holes (namely, the connecting holes 153a and 153b, and the connecting holes 154a and 154b) for realizing the flip-flop coupling what needs be provided in the regions free from the first grounding wiring 121 is only one kind of connecting holes (namely, the connecting holes 153a and 153b), so that the arrangement of the connecting hole 153b in the vicinity of the connecting hole 155a, and the connecting hole 153a in the vicinity of the connecting hole 155b is facilitated. Because of this, it becomes possible to extend the first grounding wiring 121 from the vicinity of the connecting hole 152a in the direction of the boundary between the bit (m, n+1) and the bit (m+1, n+1). Similarly, the first grounding wiring 121 can be extended from the vicinity of the connecting hole 152b in the direction of the boundary between the bit (m−1, n−1) and the bit (m, n−1). As a result, the first grounding wiring can be given a mesh-like shape as shown in FIG. 7.

Figure 8A:
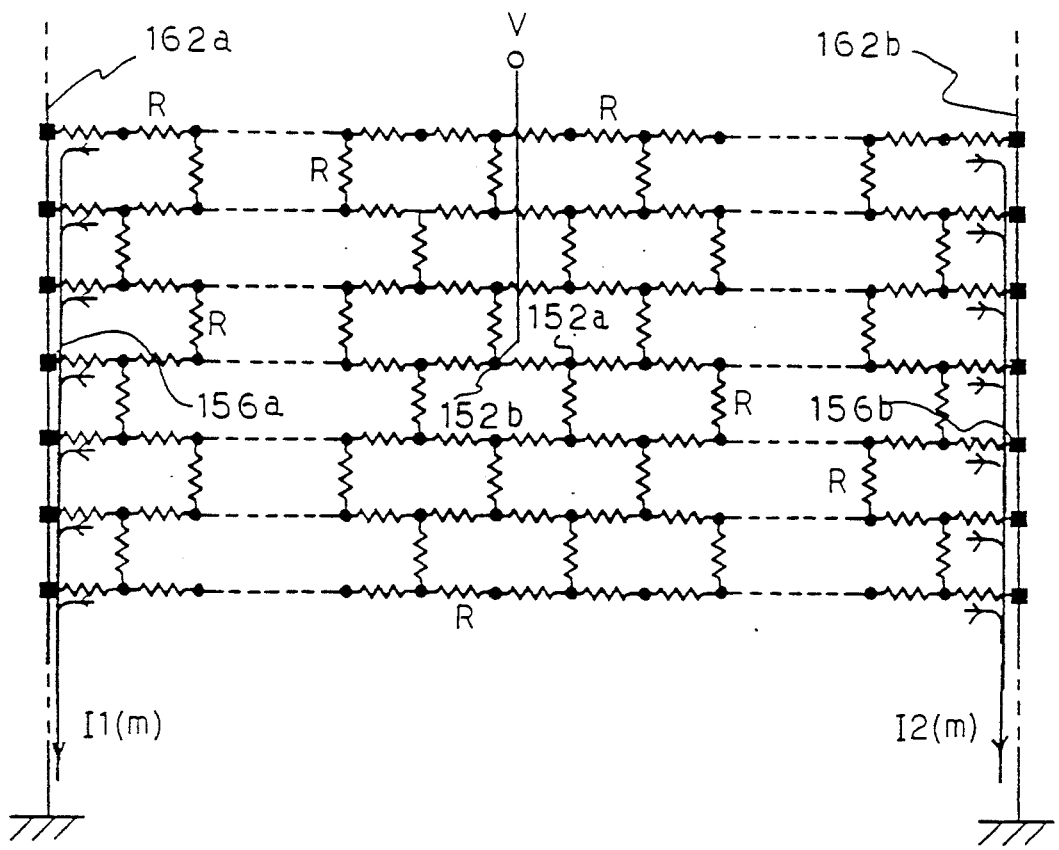
FIG. 8A is a schematic diagram showing the model of a simulation for describing the effect of the grounding wiring of the embodiment.
Figure 8B:
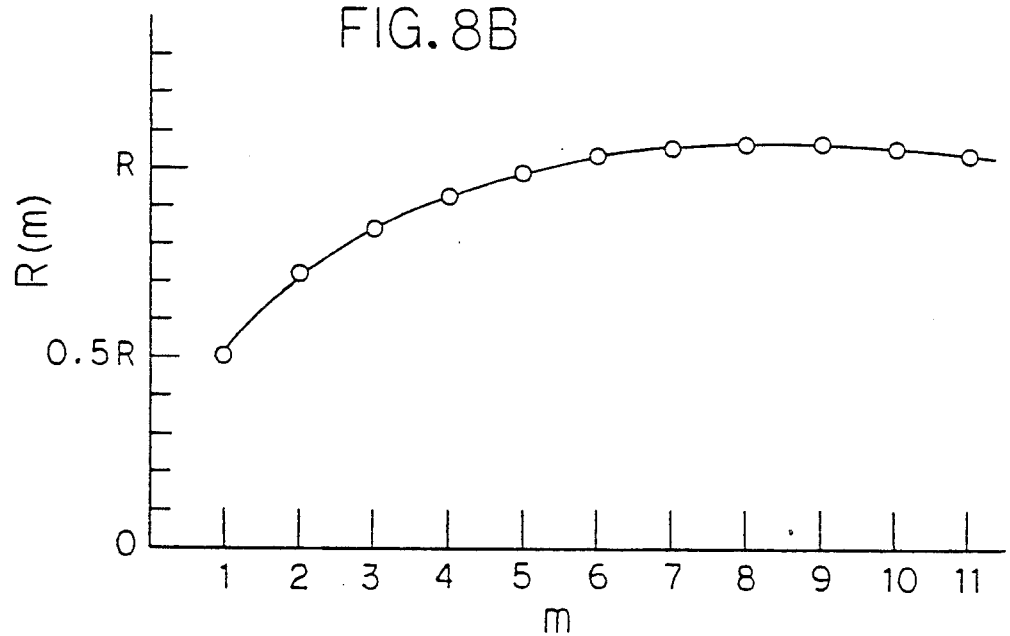
FIG. 8B is a graph showing the resulting of the simulation.
Figure 9A:
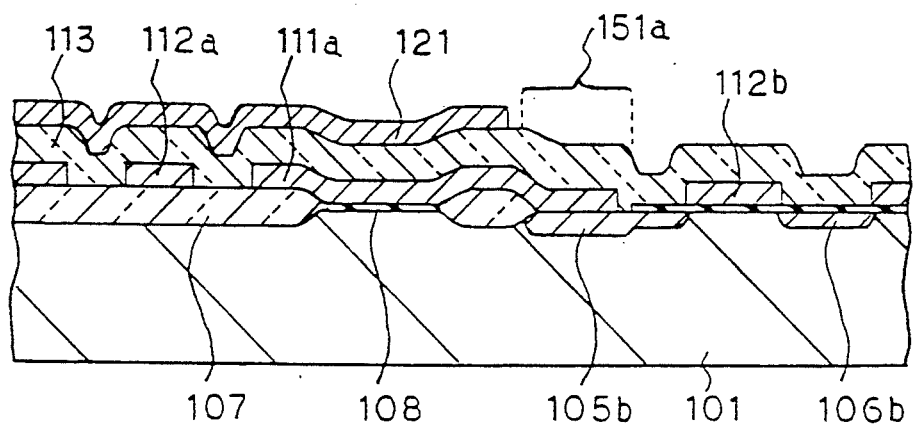
FIGS. 9A and 9B are sectional views arranged in the order of the main processes for describing the method of manufacture of SRAM of the embodiment, which are the sectional views along the line 9A—9A in FIG. 6A and line 9B—9B in FIG. 6B.
Figure 9B:
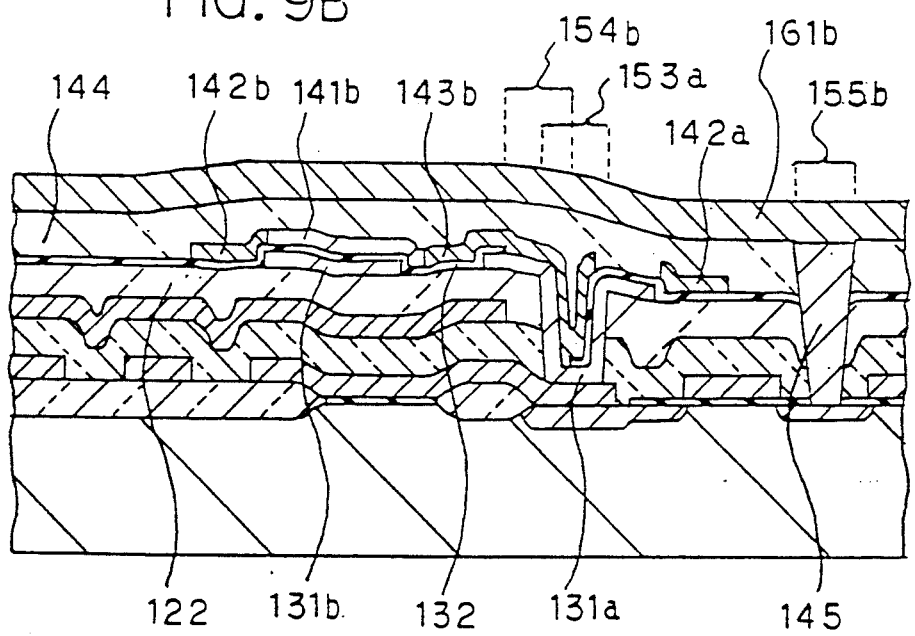

Referring to FIG. 8A for describing the model of a simulation and FIG. 8B which is a graph showing the result of the simulation, the bit dependence of the resistance of the grounding wiring for the SRAM according to this embodiment is the following.

The first grounding wiring 121 formed of a tungsten silicide film is connected for every 16 bits, for example, to the low resistance second grounding wirings 162a and 162b formed of an aluminum film, via a connecting hole 156a and a connecting hole 156b. The second grounding wirings 162a and 162b are provided in parallel with the digit lines made of an aluminum film. It is assumed that the resistances of the first grounding wiring between the two adjacent connecting holes at the connecting holes that connect the source regions of the driver transistors and the first grounding wiring are all equal to R. The simulation for the bits belonging to the n-th row is carried out by considering the effect of the bits of the seven rows ranging from the bits belonging the (n−3)-th row and the bits belonging to the (n+3)-th row [FIG. 8A].

The resistance of the first grounding wiring from the connecting hole 152b provided on the boundary of the bit (m−1, n) and the bit (m,n) to the second grounding wirings 162a and 162b made of an aluminum film, becomes a function of m, R(m). This resistance can be found from the sum of the current I1(m) that flows in the second grounding wiring 162a and the current I2(m) that flows in the second grounding wiring when a voltage V is applied to the connecting hole 152b. The result of the simulation is shown in FIG. 8B. Namely, it was found that R(1)=R(16)=0.50R, R(2)=R(15)=0.72R, . . . , R(4)=R(13)=0.93R, R(6)=R(11)=1.03R, and R(8)=R(9)=1.07R. A comparison with the result for the conventional case (see FIG. 4B) shows that the resistance value is lowered and the bit dependence is reduced. As a result, even if the cell size is reduced by adoption of the TFT type memory cells, the detection sensitivity of read by the sense amplifier can be improved, and fluctuations of the detection sensitivity from one bit to another and within the same bit can be reduced.

Moreover, in this embodiment, the region which can be covered by the first grounding wiring is increased. As shown also in FIGS. 6A and 6B, the space between the channel region 141a (especially, its off-set part) of TFT11 and the gate electrode 111b, and the space between the channel region 141b (especially, its off-set part) of TFT21 and the gate electrode 111a can fully be shielded by the first grounding wiring 121. Because of this, the leakage characteristic of the SRAM can be improved. Moreover, the influence of the digit lines on the channel regions of the TFTs is dealt with in this embodiment by increasing the thickness of the interlayer insulating film which is placed between the polycrystalline silicon film which is the fourth conductor film and the aluminum film.

However, it is also possible to form the digit lines using the second layer of aluminum film and shield the spaces between the channel regions of the TFTs and the digit lines by the first layer of aluminum film. In that case, the aluminum film for shielding may be used as the second grounding wiring, and provide a connecting hole for the first grounding wiring and the second grounding wiring on the memory cell.

In this embodiment, the capacitance between the drain region and the source region of the driver transistor can be increased by providing a first grounding wiring of the aforementioned construction. Because of this, there is improved resistance to $\alpha$ rays and improved resistance against the noise in the power supply.

Figure 10A:
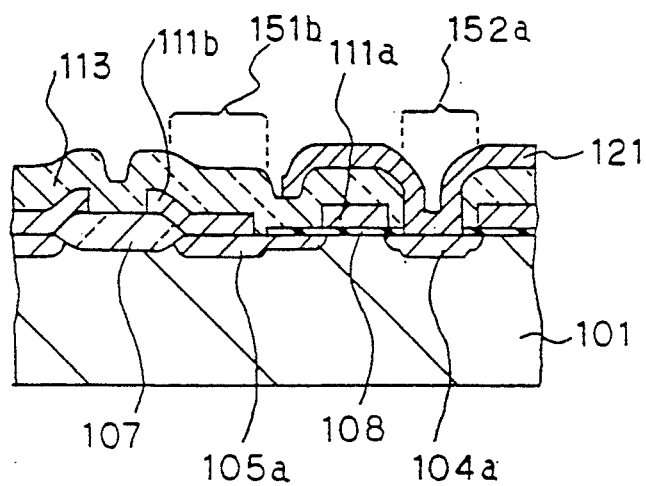
FIGS. 10A and 10B are sectional views arranged in the order of the main processes for describing the method of manufacture of SRAM of the embodiment, which are the sectional views along the line B—B in FIGS. 6A and 6B.
Figure 10B:
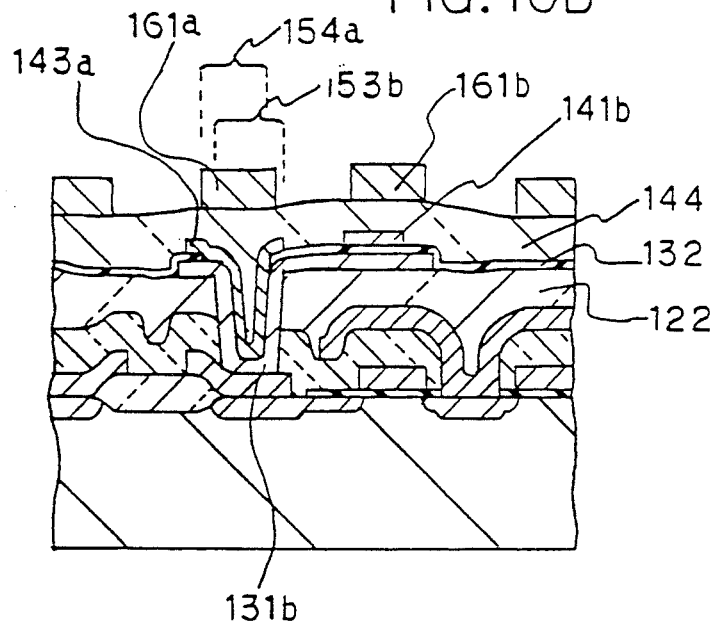

Referring to FIGS. 6A and 6B, FIGS. 9A and 9B are sectional views arranged in the order of main processes for describing the method of manufacture of the SRAM. The sectional views along the line 9A—9A in FIG. 6A and line 10B—10B in FIG. 6B, and FIGS. 10A and 10B are arranged in the order of main processes for describing the method of manufacture of the SRAM, being the sectional views along the line 10A—10A in FIG. 6A and line 10B—10B in FIG. 6B, the method of manufacture of the SRAM of this embodiment is as follows.

First, on the surface of a P-type silicon substrate 101, a field oxide film 107 with thickness of about 400 nm and a first gate oxide film 108 with thickness of about 12 nm are formed. After formation of connecting holes 151a and 151b, a first conductor film is formed by a CVD method or the like. This first conductor film is a tungsten polycide film obtained by laminating an N+-type polycrystalline silicon film with thickness of about 50 nm and a tungsten silicide film with thickness of about 100 nm. By patterning the tungsten polycide film by using a silicon oxide film (not shown) with a thickness of about 100 nm formed on the tungsten polycide film as the mask, gate electrodes 111a and 111b and word lines 112a and 112b are formed. Following the formation of side-walls (not shown) and the like with a silicon oxide film, ion implantation of N impurity, and the like, channel regions 102a, 102b, 103a, and 103b, and LDD N+-type diffused layers 104a, 104b, 105a, 105b, 106a, and 106b are formed. Then, a first interlayer insulating film 113, consisting of a silicon oxide film with thickness of about 200 nm, is formed by a high temperature CVD method. After the formation of connecting holes 152a and 152b, a tungsten silicide film with thickness of about 100 nm which is a second conductor film is formed, and a first grounding wiring 121 is formed by patterning this conductor film [FIGS. 6A, 9A, and 10A].

Next, a silicon oxide film with a thickness of about 100 nm by a high temperature CVD method and a BPSG film with thickness of about 500 nm by a CVD method are deposited, this laminated film is subjected to reflow by a heat treatment of 20 min at 850° C. in a nitrogen atmosphere, then etched back, to form a flattened second interlayer insulating film 122 with thickness of 200 nm. After formation of connecting holes 153a and 153b, an N+-type polycrystalline silicon film with a thickness of about 70 nm, which is a third layer of conductor film, is formed. The sheet resistivity of this film is several kΩ/cm$^3$. By patterning the polycrystalline silicon film, gate electrodes 131a and 131b are formed. By a high temperature CVD method at 800° C. a second gate oxide film 132 consisting of a silicon film 132 with a thickness of about 20 nm is formed.

Next, after formation of connecting holes 154a and 154b, an amorphous silicon film with a thickness of about 40 nm is deposited. This amorphous silicon film is converted to a polycrystalline silicon film by a heat treatment at 600° C. for 6 hours. By the implantation of an N-type impurity in this polycrystalline silicon film and by the patterning of this film, channel regions 141a and 141b, P+-type diffused regions 142a, 142b, 143a, and 143b, and the like, are formed. The channel regions 141a and 141b have off-set parts that extend respectively in the directions of the P+-type diffused regions 143a and 143b. A silicon oxide film with a thickness of about 200 nm by a high temperature CVD method and a BPSG film with a thickness of about 600 nm by a CVD method are deposited. This laminated film is subjected to reflow by a heat treatment for 20 min. at 850° C. in a nitrogen atmosphere, then etched back to form a flattened third interlayer insulating film 144 with a thickness of about 300 nm. The reason for forming the silicon oxide film by the high temperature CVD method is to prevent direct contact of the BPSG film with the channel regions 141a and 141b of the TFTs and the P+-type diffused layers 142a, 142b, 143a, and 143b. In addition, the bottom faces of the P+-type diffused regions 142a, 142b, 143a, and 143b will not be brought in to direct contact with a second interlayer insulating film 122 because of the presence of a second gate oxide film. After the formation of connecting holes 155a, 155b, and a contact plug 145 consisting of an N+-type polycrystalline silicon film, is formed for the connecting holes 155a and 155b. *The conditions for the heat treatment needed for the formation of these plugs are also a nitrogen atmosphere,* 850° C. and 20 min. After the formation of a titanium film and a titanium nitride film as barrier metal layers, an aluminum-silicon-copper alloy film with a thickness of about 400 nm is formed, and digit lines 161a and 161b (and second grounding wirings 162a and 162b) are formed by patterning the laminated film consisting of these films [FIGS. 6A, 6B, 9B, and 10B].

The method of manufacture in the above relates to the memory cell of an SRAM. However, when the peripheral circuit of the SRAM is a CMOS containing P-channel MOS transistors formed on the surface of a silicon substrate, an N-type silicon substrate is used in place of the P-type silicon substrate 101, and an N well and a P well are formed in this substrate to form a CMOS. At this time, the P-channel MOS transistor has P+-type diffused layers of the sidewall type.

Although the invention has been described with reference to specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. In a semiconductor memory device in which one static memory cell includes first and second load transistors consisting of P-channel type thin film transistors, a first and second driver transistors including an N-channel MOS transistor formed on the surface of a silicon substrate, first and second access transistors including an N-channel MOS transistor formed on the surface of said silicon substrate, a word line, first and second digit lines, a power supply wiring, and a first grounding wiring, the gate electrodes of said first and said second driver transistors and the gate electrodes of said first and said second access transistors that also serve as said word lines are formed of a first conductor film consisting of a material having a melting point higher than that of aluminum, said first grounding wiring within said memory cell being formed of a second conductor film including a material having a melting point higher than that of aluminum, wherein said first grounding wiring is connected to a second grounding wiring formed of an aluminum film in a predetermined region outside of said memory cell, and said first and said second load transistors being formed of a third conductor film including a material having a melting point higher than that of aluminum and a fourth conductor film consisting of a material having a melting point higher than that of aluminum: wherein;

the semiconductor memory device in the sad word lien is branched within the memory cell to a first word lien that also serves as the gate electrode of said first access transistor and a second word line that also serves as the gate electrode of said second access transistor, said first word line and said second word line being connected at a predetermined location outside said memory cell, and said first load transistor and said second load transistor, said first driver transistor and said second driver transistor, and said first access transistor and said second access transistor being respectively arranged at point symmetric positions with respect to the same reference point within the memory cell;

said first grounding wiring, being in the vicinity of the respective connecting holes in the direction of the boundary between symmetrical bits, extending respectively in the direction parallel to said first and said second digit lines and in the direction parallel to said word line, thereby forming a mesh like shape.

2. A semiconductor memory device as claimed in claim 1 further characterized in that said first grounding wiring is provided between the respective channel regions of said first and said second load transistors and the respective gate electrodes of said second and said first driver transistors.

3. A semiconductor memory device as claimed in claim 1, wherein said first grounding wiring is formed of a high melting point metal or a silicide or a polycide.

4. A semiconductor memory device as claimed in claim 1 wherein said first and said second TFTs are of bottom gate type and said third conductor film is an N-type polycrystalline silicon film.

5. A semiconductor memory device as claimed in claim 4, wherein the channel regions of said first and said second TFTs have off-set parts that extend respectively in the directions of the drain regions of said first and said second TFTs.

6. A semiconductor memory device as claimed in claim 2, wherein said first grounding wiring is formed of a high melting point metal or a silicide or a polycide.

7. A semiconductor memory device as claimed in claim 2, wherein said first and said second TFTs are of bottom gate type and said third conductor film is an N-type polycrystalline silicon film.

8. A semiconductor memory device as claimed in claim 3, wherein said first and said second TFTs are of bottom gate type and said third conductor film is an N-type polycrystalline silicon film.

* * * * *